(12) United States Patent
Fan

(10) Patent No.: US 8,172,598 B2
(45) Date of Patent: May 8, 2012

(54) ELECTRICAL CONNECTOR HAVING IMPROVED BASE PLATE TO SUPPORT CAM

(75) Inventor: Chia-Wei Fan, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 29 days.

(21) Appl. No.: 12/892,939

(22) Filed: Sep. 29, 2010

(65) Prior Publication Data

US 2011/0076870 A1  Mar. 31, 2011

(30) Foreign Application Priority Data

Sep. 30, 2009  (TW) .................................. 98218082

(51) Int. Cl.
  *H01R 4/50* (2006.01)
(52) U.S. Cl. ....................................... 439/342; 439/259
(58) Field of Classification Search .......... 439/259–269, 439/342
  See application file for complete search history.

(56) References Cited

U.S. PATENT DOCUMENTS

| | | |
|---|---|---|
| 6,250,941 B1 | 6/2001 | Huang et al. |
| 6,254,415 B1 | 7/2001 | Mizumura |
| 6,280,224 B1 | 8/2001 | Huang |
| 6,296,507 B1 | 10/2001 | Huang |
| 6,338,640 B1 | 1/2002 | Lin |
| 7,878,839 B2 * | 2/2011 | Cheng et al. .................. 439/342 |
| 7,892,009 B2 * | 2/2011 | Szu ............................... 439/342 |

* cited by examiner

*Primary Examiner* — Khiem Nguyen
(74) *Attorney, Agent, or Firm* — Andrew C. Cheng; Wei Te Chung; Ming Chieh Chang

(57) ABSTRACT

An electrical connector includes a base, a cover, a protecting mechanism, and a cam. The base has a contacting area with a plurality of passageways and a first end besides the contacting area with an opening in a first end thereof. The cover is slidably mounted upon the base. The cover defines a plurality of through holes in alignment with the corresponding passageways, respectively, and another opening is defined in a second end thereof and in vertical alignment with the corresponding opening of the base. The protecting mechanism includes a metallic base plate mounted upon the base and defining a stepping hole which includes a larger first hole and a smaller second hole via a drawing process, disposed in the opening of the base. The cam extends axially and vertically in the opening of the cover and the stepping hole of the base, and is riveted on a bottom surface of the base plate.

8 Claims, 5 Drawing Sheets

ELECTRICAL CONNECTOR HAVING IMPROVED BASE PLATE TO SUPPORT CAM

BACKGROUND OF THE INVENTION

1. Field of the invention

The present invention relates to an electrical connector, and more particularly to an electrical connector having a base incorporated with a base plate and a cam, the cam directly rivets on a bottom surface of the base plate, and the base plate having a drawn hole so as to decrease frictional coefficient between the base plate and the cam received in the hole.

2. Description of Related Art

Mostly Central Process Unit (CPU) is connected with a printed circuit board by an electrical connector, that is disclosed in "BAG Socket: a dendrite solution" (P460-P466, 1996 IEEE 46$^{th}$ Electronic Components & Technology Conference). In addition, the electrical connector is manufactured to have a cam actuator for a low profile application, such as demonstrated by the U.S. Pat. Nos. 6,250,941, 6,254,415, 6,280,224, 6,296,507 and 6,338,640. U.S. Pat. No. 6,338,640 issued to Lin on Jan. 15, 2002 discloses an electrical connector with a cam actuator. The electrical connector comprises an insulative base, a cover, a plurality of terminals received in the base, a metallic cam actuator, and a protecting mechanism. The protecting mechanism includes a cover plate mounted into the cover and a base plate mounted into the base. The cover, cover plate, base plate, and base respectively defines an opening to allow the cam actuator to pass therethrough, and a washer is used to secure a bottom part of the base.

The cover plate and the base plate are both manufactured by die casting, so the base plate has a comparable coarse surface to engage with the cam actuator, and it will inevitably increase a frictional coefficient between the base plate and the cam actuator exhausting additional energy when operating the cam mechanism. In addition, the cam needs another element, such as the washer, to be secured in the electrical connector, that makes the structure of the electrical connector complex and increases steps of the assembling process.

Therefore, a socket connector discussed above with improved cam mechanism is required.

SUMMARY OF THE INVENTION

An object of the present invention is to provide an electrical connector having a cam and a base with a base plate, the cam directly rivets on a bottom surface of the base plate, and the base plate having a drawing hole so as to decrease frictional coefficient between the base plate and the cam received in the hole.

To achieve the aforementioned object, an electrical connector comprises an insulative base, an insulative cover, a protecting mechanism, and a cam. The insulative base has a contacting area with a plurality of passageways and a first end besides the contacting area with an opening in a first end thereof The insulative cover is slidably mounted upon the base. The insulative cover defines a plurality of through holes in alignment with the corresponding passageways, respectively, and another opening is defined in a second end thereof and in vertical alignment with the corresponding opening of the base. The protecting mechanism includes a metallic base plate mounted upon the base and defining a stepping hole, which includes a larger first tubular hole and a smaller second hole located below the first hole via a drawing process, disposed in the opening of the insulative base. The cam extends axially and vertically in the opening of the cover and the stepping hole of the base, and is riveted on a bottom surface of the base plate.

To further achieve the aforementioned object, an electrical connector comprises a base, a cover slidably mounted upon the base, a cam, and a protecting mechanism. The base has a contacting area with a plurality of passageways and a first end besides the contacting area with an opening in a first end thereof The cover defines a plurality of through holes in alignment with the corresponding passageways, respectively, and another opening defined in a second end thereof and in vertical alignment with the corresponding opening of the base. The cam extends vertically through both said openings of the cover and the base. The protecting mechanism includes a cover plate mounted in the cover and a base plate mounted upon the base. The base plate includes a first sidewall extending downwardly into the opening of the base and sandwiched between the cam and the base. A horizontal sidewall extends from a bottom edge of the first sidewall and the cam directly riveted on the horizontal sidewall.

Other objects, advantages and novel features of the invention will become more apparent from the following detailed description of a preferred embodiment when taken in conjunction with the accompanying drawings.

DETAILED DESCRIPTION OF THE INVENTION

Figure 1:
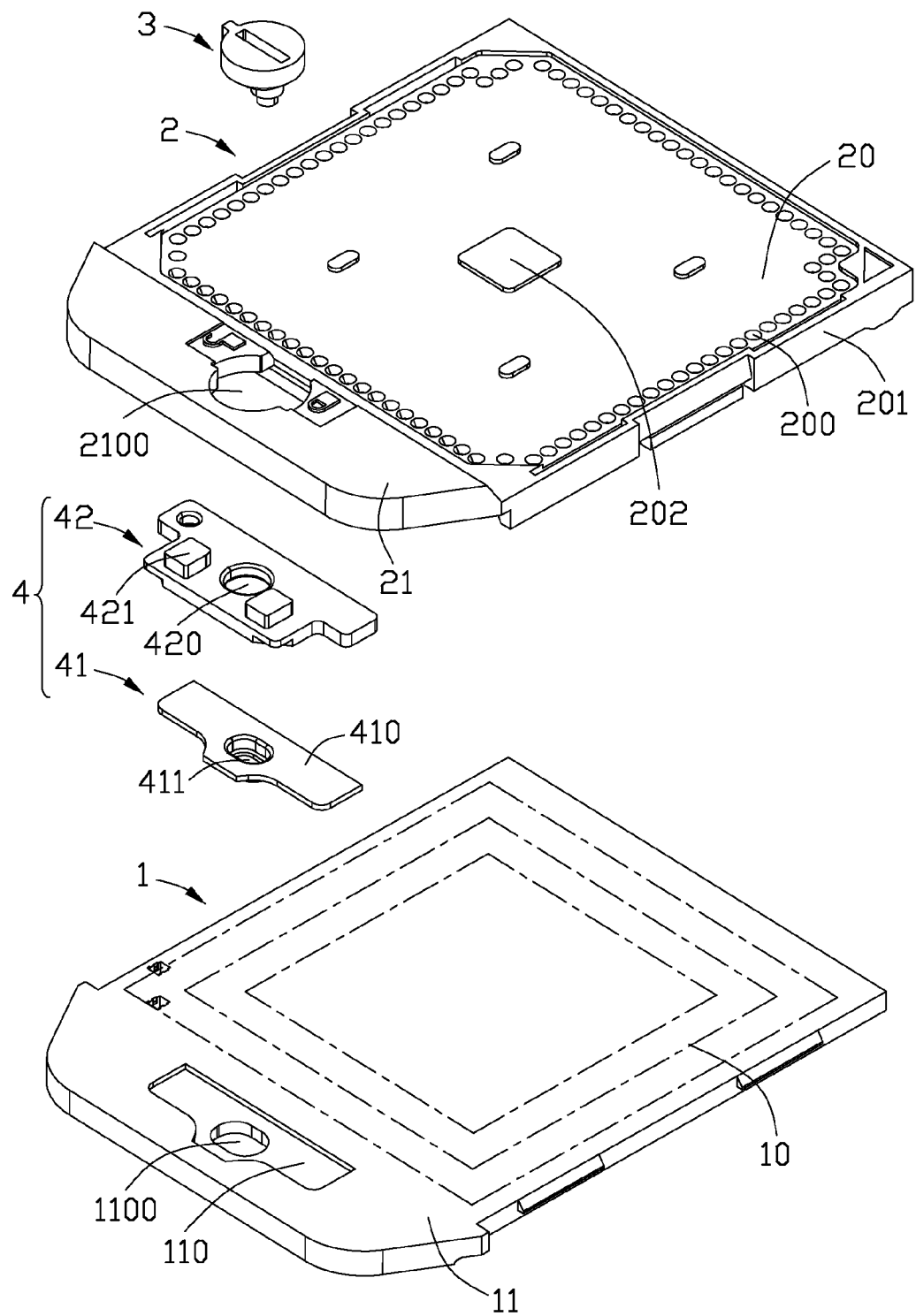
FIG. 1 is an exposed, perpective view of an electrical connector in accordance with the present invention.
Figure 2:
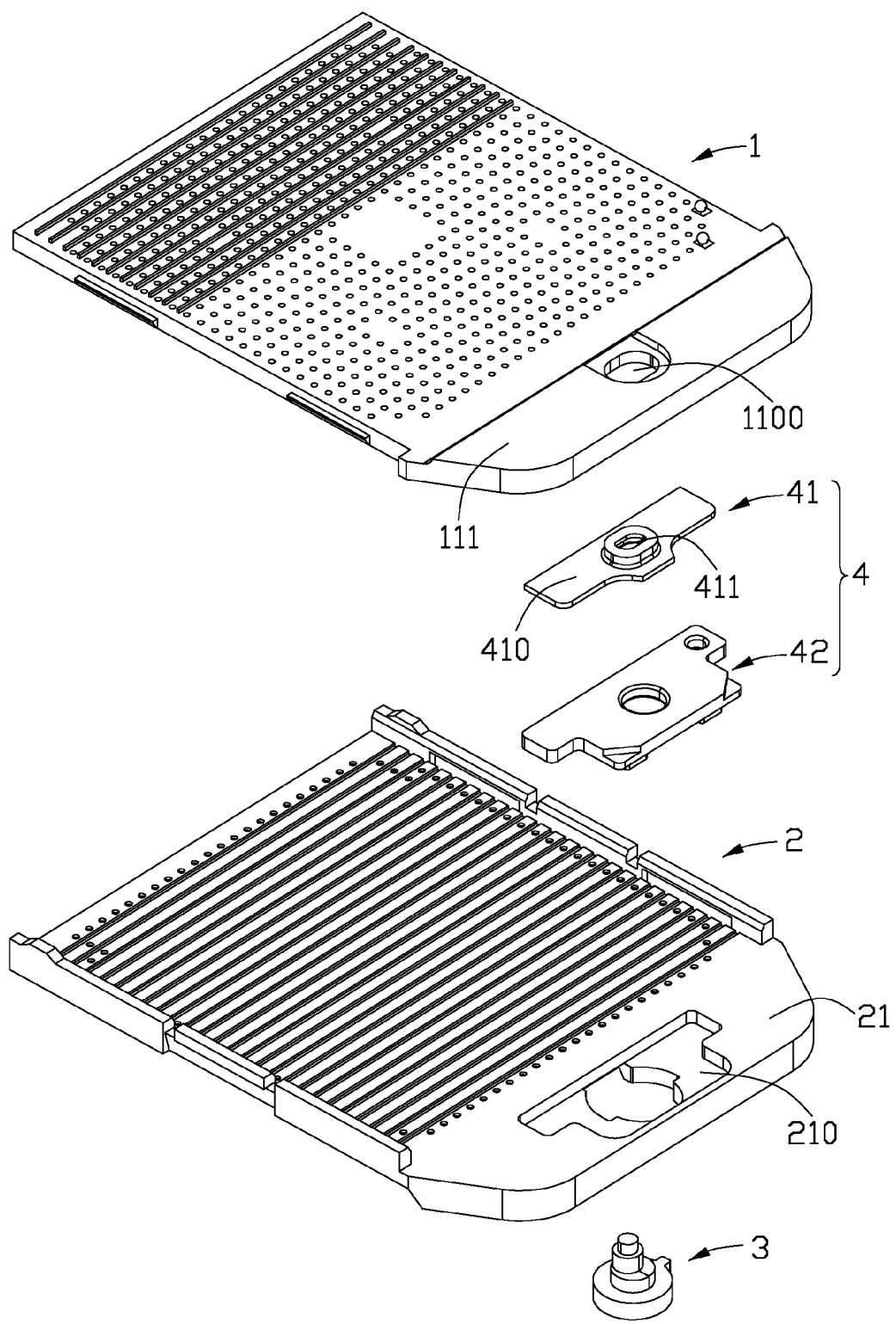
FIG. 2 is similar with FIG. 1, but taken from another side.

FIG. 1 to FIG. 4 show an electrical connector for electrically connecting a printed circuit board (not shown) to a Pin Grid Array (PGA) package (not shown). The electrical connector comprises a base 1, a cover 2 slidably mounted to the base 1, a cam 3 mounted between the cover 2 and the base 1, and a protecting mechanism 4. The protecting mechanism 4 includes a base plate 41 mounted to the base 4 and a cover plate 42 mounted to the cover 2.

The base 1 is configured with a planar plate and made of insulative material. The base 1 defines a contacting area 10 receiving a plurality of contacts (not shown) and a first end 11 disposed at one end of the contacting area 10. A first recess 110 is defined on a top surface of the first end 10 and a supporting portion 111 protrudes downwardly from a bottom surface of the first end 11 such that it is lower than a bottom surface of the contacting area 10. The cover 2 is moveably mounted upon the base 1. The cover 2 includes a mating area 20 corresponding to the contacting area 10 and a second end 21 corresponding to the first end 11 of the base 1, and the second end 21 is higher than the mating area 20. The mating area 20 defines a plurality of through holes 200 corresponding to the contacts (not shown) to allow pin legs (not shown) of the package (not shown) to pass therethrough to mate with the contacts (not shown). A pair of vertical sidewalls 201 extend downwardly from two opposite sides of the mating area 20 to engage with corresponding sides of the base 1, and a plurality of protrusions 202 extend upwardly from an upper surface of the mating area 20 for supporting the package (not shown). A second recess 210 is defined on a bottom surface of the second end 21 to receive the cover plate 42. Each of the cover 2, the base 1 and the cover plate 42 defines an opening 2100, 1100, 420, respectively, and the base plate 41 defines a stepping hole 411.

Figure 5:
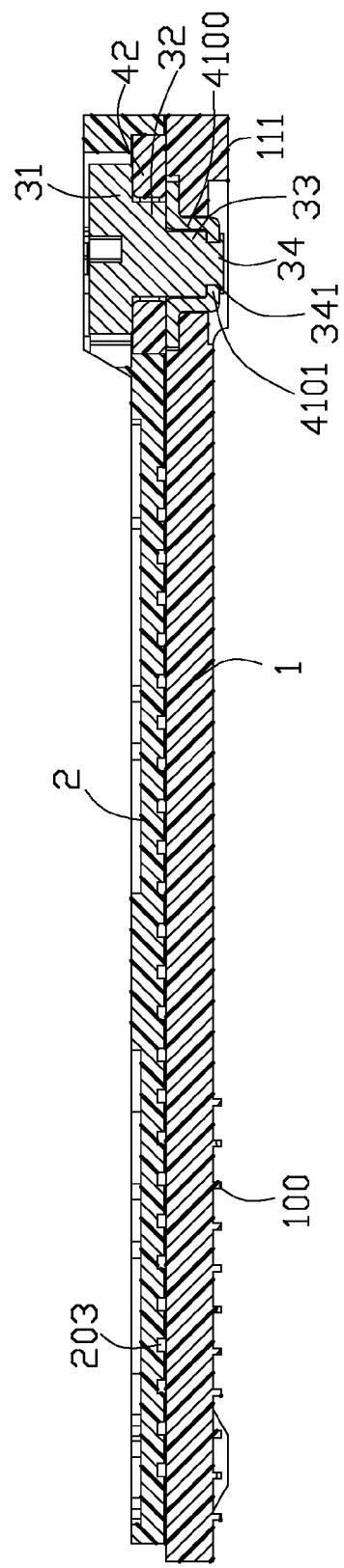
FIG. 5 is a cross-sectional view taken along line 5-5 of FIG. 4.

Referring to FIG. 5, conjoined with FIG. 1, the cam 3 comprises a first post 31 received in the opening 2100 of the cover 2, a second post 32 received in the opening 420 of the cover plate 42, and a third post 33 and a fourth post 34 both received in the stepping hole 411. Center axes of the second and the third posts 32, 33 are offset from each other, and the diameters of all the posts are gradually smaller. The first post 31 has a stopper 310 (referring to FIG. 4) to engage with the cover plate 42.

Figure 3:
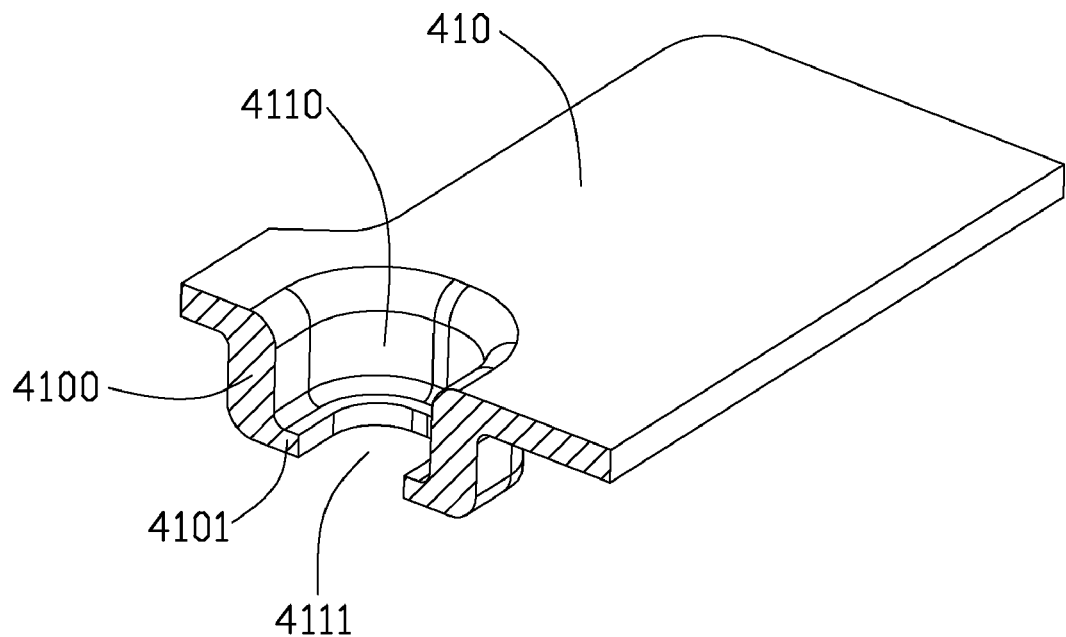
FIG. 3 is a cross-sectional, perpective view of a base plate of the electrical connector in accordance with the present invention.
Figure 4:
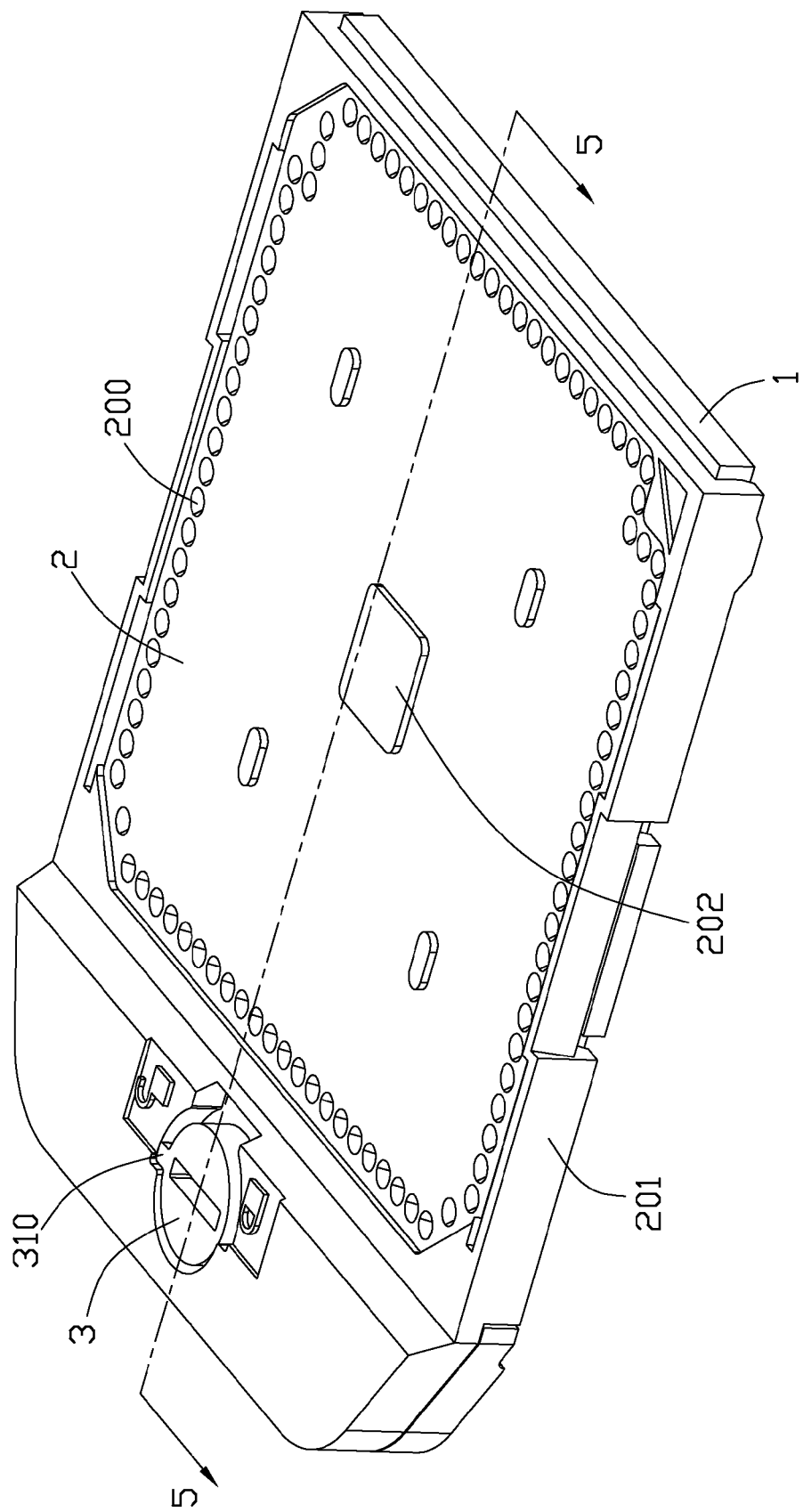
FIG. 4 is an assembled, perpective view of the electrical connector in accordance with the present invention.

The cover plate 42 is inserted into the cover 2 and has two blocks 421 engaging with the stopper 310 to limit the cam 3 rotating between an opened and closed position. Referring to FIG. 3, the base plate 41 can be made of metallic material and plastic material. The base plate 41 comprises a planar board 410 and the stepping hole 411 drawn downwardly from a center area of the planar board 410. The stepping hole 411 comprises a first tubular hole 4110 to retain and surround the third post 33 of the cam 3 and a second hole 4111 to engage with the fourth post 34. The first hole 4110 is defined by a first vertical sidewall 4100 extending downwardly from the planar board 410, and the second hole 4111 is defined by a second horizontal sidewall 4101 extending inwardly toward a center thereof from a bottom edge of the first sidewall 4110, so the diameter of the first hole 4110 is larger than that of the second hole 4111.

FIG. 5 is a cross-sectional view of the electrical connector without showing the contacts and the through holes 200 of the cover 2. A plurality of channels 203 are defined on a bottom surface of the mating area 20 of the cover 2 to prevent the cover 2 from warping. A plurality of ribs 100 are disposed on a bottom surface of the base 1 and have a same height with the supporting portion 111 to prevent the base 1 from warping and to support the base 1. The base plate 41 is assembled in the electrical connector as follow: the planar board 410 is located in the first recess 110, the first sidewall 4100 and the second sidewall 4101 extends into the opening 1100 and part of second sidewall 4101 is exposed out of the opening 1100. The first sidewall 4100 provides a smooth surface to engage with the third post 33 of the cam 3, so as to reduce the torque created by rotating the cam 3. The cam 3 is directly riveted to the second horizontal sidewall 4101 of the stepping hole 411 to form a securing plate 341 to prevent the cam 3 from dropping out. The second sidewall 4101 is made by drawing and increases an overall height of the base plate 41 to improve an intensity of the base plate 41.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising: an insulative base having a contacting area with a plurality of passageways and a first end besides the contacting area with an opening; an insulative cover slidably mounted upon the base, the cover defining a plurality of through holes in alignment with the corresponding passageways, respectively, and another opening defined in a second end thereof and in vertical alignment with the corresponding opening of the base; a protecting mechanism including a metallic base plate mounted upon the base, and defining a stepping hole, which includes a larger first tubular hole and a smaller second hole located below the first hole via a drawing process, disposed in the opening of the insulative base; and a cam extending axially and vertically in the opening of the cover and the stepping hole of the base, and being riveted to a bottom surface of the base plate, wherein the first hole is configured by a first sidewall extending vertically and downwardly from the base plate, and the second hole is surrounded by a second sidewall extending horizontally and inwardly toward a center from a bottom edge of the first sidewall, wherein the protecting mechanism further includes a cover plate mounted below the cover and defining a hole thereof.

2. The electrical connector as claimed in claim 1, wherein the cam comprises a first, a second, a third, and a fourth posts, center axes of the second and the third posts are offset, and the diameters of all the posts are gradually smaller from top to bottom, and a stopper is disposed on the first post to engage with the cover plate.

3. The electrical connector as claimed in claim 2, wherein the first post is received in the hole of the cover, the second post is received in hole of the cover plate, and the third post and the fourth post are both received in the stepping hole of the base plate.

4. The electrical connector as claimed in claim 3, wherein the third post is retained in the first hole, and the fourth post extends through the second hole and is riveted to the second sidewall to form with a securing plate.

5. The electrical connector as claimed in claim 4, wherein a plurality of channels are defined on a bottom surface of the cover to prevent the cover from warping, and a plurality of ribs are disposed on a bottom surface of the base to prevent the base from warping.

6. An electrical connector comprising: a base having a contacting area with a plurality of passageways and a first end besides the contacting area with an opening; a cover slidably mounted upon the base, the cover defining a plurality of through holes in alignment with the corresponding passageways, respectively, and another opening defined in a second end thereof and in vertical alignment with the corresponding opening of the base; a cam extending vertically through both said openings of the cover and the base; and a protecting mechanism including a cover plate mounted in the cover and a base plate mounted upon the base, the base plate including a first sidewall extending downwardly into the opening of the base and sandwiched between the cam and the base, a horizontal sidewall extending from a bottom edge of the first sidewall, the cam directly riveted on the horizontal sidewall, wherein the first sidewall extending downwardly from the base plate to forms a first hole, and the second horizontally sidewall extends inwardly from the first sidewall to form a second hole, wherein the first sidewall is formed by drawing.

7. The electrical connector as claimed in claim 6, wherein the cam extends out of the second hole and has a securing plate.

8. The electrical contact as claimed in claim 6, wherein a plurality of channels are defined on a bottom surface of the cover to prevent the cover from warping, and a plurality of ribs are disposed on a bottom surface of the base to prevent the base from warping.

* * * * *